(12) United States Patent
Nairn (10) Patent No.: US 7,012,463 B2
(45) Date of Patent: Mar. 14, 2006

(54) SWITCHED CAPACITOR CIRCUIT WITH REDUCED COMMON-MODE VARIATIONS

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 185 days.

(21) Appl. No.: 10/745,756

(22) Filed: Dec. 23, 2003

(65) Prior Publication Data

US 2005/0134380 A1    Jun. 23, 2005

(51) Int. Cl.
*H03F 3/45* (2006.01)

(52) U.S. Cl. .......................... 330/9; 330/258; 330/259
(58) Field of Classification Search ................. 330/9, 330/258, 259; 327/124, 307, 563
See application file for complete search history.

(56) References Cited

U.S. PATENT DOCUMENTS

| | | | |
|---|---|---|---|
| 5,838,200 A * | 11/1998 | Opris | 330/258 |
| 6,285,311 B1 | 9/2001 | Lewicki | 341/172 |
| 6,362,682 B1 | 3/2002 | Shulman | 327/562 |
| 6,400,301 B1 | 6/2002 | Kulhalli | 341/155 |
| 6,577,184 B1 | 6/2003 | Kwan | 330/9 |
| 6,750,715 B1 * | 6/2004 | Allott et al. | 330/258 |

OTHER PUBLICATIONS

David Johns and Ken Martin, Analog Integrated Circuit Design, 1997, pp. 287-291.

* cited by examiner

*Primary Examiner*—Steven J. Mottola
(74) *Attorney, Agent, or Firm*—Koppel, Jacobs, Patrick & Heybl (57) ABSTRACT

A circuit with a common-mode dual output includes a feedback circuit connected to alternate the states of the dual output between an average output level and a desired common-mode level. The difference between the average and desired levels is proportional to a signal offset level. An impedance matching circuit is connected to the feedback circuit to adjust the signal offset level.

29 Claims, 6 Drawing Sheets

SWITCHED CAPACITOR CIRCUIT WITH REDUCED COMMON-MODE VARIATIONS

BACKGROUND OF THE INVENTION

1. Field of the Invention

This invention relates generally to electronic circuits and, more particularly, to electronic circuits which include switched capacitor circuitry.

2. Description of the Related Art

For high performance signal conditioning systems, most analog circuits use dual output differential amplifiers. Differential amplifiers amplify the difference between positive and negative input signals and allow the rejection of noise from the substrate and clock signals coupled to the amplifier. However, differential amplifiers also amplify the average of the positive and negative input signals which is generally referred to as the common-mode.

The common-mode limits the common-mode rejection ratio (CMRR) which is defined as the ratio of the differential mode gain to the common-mode gain. Hence, the CMRR can be increased by decreasing the common-mode gain. In differential amplifiers, the common-mode gain can be reduced by including a common-mode feedback loop. In some differential amplifiers, the feedback loop can include switched capacitor circuits as disclosed in U.S. Pat. No. 6,400,301 or as disclosed in D. A. Johns and K. Martin, Analog Integrated Circuit Design, John Wiley and Sons, New York, 1997, Pgs 287–291.

Switched capacitor circuits typically include a number of switches coupled to capacitors where the switches are configured to alternately store and transfer charge between the capacitors. When the switched capacitor circuit is coupled to the differential amplifier, the capacitors can sense the average or common-mode of the output and then compare the average with a desired common-mode. The difference between the average common-mode and the desired common-mode can be used in a feedback loop which drives the difference to zero.

The switches are designed to alternate between two phases or operational modes to control the amplification of the input signals. In some applications, the amplifier is active during a first phase so the common-mode in a second phase is not as critical. However, it may still be desired to control the common-mode during both phases for several reasons. One reason is that the common-mode in the second phase should settle to the common-mode in the first phase to minimize any delays.

Another reason is that in some applications, both the first and second phases are used to amplify the signal. This is often referred to as "amplifier sharing" where it is desired to have the same common-mode for both phases so that the amplification is constant. Hence, it is desired to have the same common-mode when switching between phases to minimize the dependence of the output signal on the common-mode.

The common-mode level at the amplifier's output can vary due to changes in the common-mode feedback circuit. Small errors within the common-mode feedback circuit are multiplied by the common-mode error gain to provide a common-mode error that varies from one clock phase to the next. These common-mode variations reduce the available signal range for differential amplifiers which is further reduced as circuit supply voltages are reduced. Hence, the common-mode and the common-mode error gain are a concern for low power and portable electronic applications.

BRIEF SUMMARY OF THE INVENTION

In one aspect of the present invention, a circuit with a common-mode dual output includes a common-mode circuit with an output portion. A common-mode corrector circuit is connected to alternate the states of the output portion between an average output level and a desired common-mode level. The difference between the average output level and the desired common-mode level is proportional to a signal offset level. An error correcting circuit is connected to the common-mode corrector circuit to adjust the signal offset level.

In another aspect of the present invention, an integrated circuit includes a differential amplifier circuit with an output portion and a current sinking portion. The output portion includes dual outputs which provide an average output level. A common-mode feedback circuit is coupled to the output portion to provide a desired common-mode level in a first operational mode and generates a feedback signal proportional to the difference between the average output level and the desired common-mode level in a second operational mode. The feedback signal is coupled to the current sinking portion. An impedance matching circuit is connected to the feedback circuit to adjust the feedback signal.

In other aspects of the present invention, a switched capacitor amplifier provides an output signal in response to an input signal and corrects the average output level of the output signal in accordance with a desired common-mode level. The switched capacitor amplifier includes a differential amplifier with an output portion and a current sinking portion where the output portion provides the output signal. A switched capacitor common-mode feedback circuit is coupled between the output portion and the current sinking portion where the feedback circuit is configured to alternate the states of the output portion between the average output level on a precharging capacitor and the desired common-mode level on a common-mode feedback capacitor in response to alternating clock cycles. The difference between the average and desired levels is proportional to a signal offset level. An impedance matching circuit is coupled to the feedback circuit to reduce the signal offset level. The impedance matching circuit includes a charge balancing switch configured to reduce feedthrough between the differential amplifier and the feedback circuit.

These and other features, aspects, and advantages of the present invention will become better understood with reference to the following drawings, description, and claims.

DETAILED DESCRIPTION OF THE INVENTION

Figure 1:
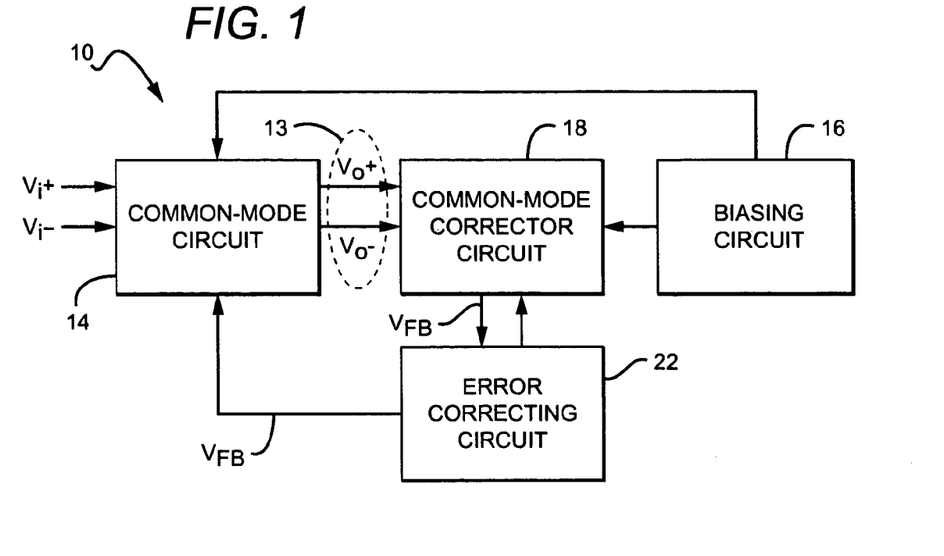
FIG. 1 is a simplified block diagram of a signal conditioning system in accordance with the present invention.

FIG. 1 illustrates a simplified block diagram of a signal conditioning system 10 in accordance with the present invention. System 10 can be included in a signal conditioning system such as an operational amplifier, an analog to digital converter, a digital to analog converter, or a similar circuit where it is desired to amplify the difference between two signals.

In one embodiment, system 10 includes a common-mode circuit 14 coupled to a common-mode corrector circuit 18 through an output port 13. Circuit 14 is also coupled to common-mode corrector circuit 18 through an error correcting circuit 22. A biasing circuit 16 is coupled to common-mode circuit 14 and common-mode corrector circuit 18 to provide power and to set an operating point for common-mode circuit 14.

Port 13 includes differential output terminals $V_o^+$ and $V_o^-$ which provide respective differential output signals $v_o^+$ and $v_o^-$ in response to differential input signals $v_i^+$ and $v_i^-$ at terminals $V_i^+$ and $V_o^-$. It should be noted that here and in the following discussion, a physical terminal or component included in system 10 will be indicated with a capital letter and a signal or a measurable value will be indicated with a lower case letter. For example, the differential output terminals are referred to as $V_o^+$ and $V_o^-$ while signals at the respective differential output terminals are referred to as $v_o^+$ and $v_o^-$.

The average of the output signals measured on terminals $V_o^+$ and $V_o^-$ is commonly known as the common-mode signal or level, and will be denoted as $v_{cm}^{avg}$. The desired common-mode signal or level at a terminal $V_{cm}$ will be referred to as $v_{cm}$ and the difference between signals $V_{cm}^{avg}$ and $v_{cm}$ (i.e. $V_{cm}^{avg} - V_{cm}$) will be referred to as the common-mode variation.

In the following discussion, it should be noted that it is typically desired to drive signal $V_{cm}^{avg}$ to be equal to signal $v_{cm}$ during the operation of common-mode circuit 14 so that the difference is zero and, consequently, the common-mode variation is reduced. It is also typically desired to reduce the changes in the common-mode variation when switching from one phase or operational mode to another.

In accordance with the invention, error correcting circuit 22 can be configured to reduce changes in the common-mode variation when switching between phases by balancing the load coupled to terminals $V_o^+$ and $V_o^-$ and by correcting for charge injection errors. Further, common-mode corrector circuit 18 is configured to compare signal $v^{cm avg}$ with signal $v_{cm}$ and provide a feedback signal $v_{FB}$ at a terminal $V_{FB}$ coupled to circuit 14 where signal $v_{FB}$ is proportional to signal $v_{cm}^{avg}$. It should be noted that in other embodiments, common-mode corrector circuit 18 can provide a feedforward signal or another signal which is proportional to signal $v_{cm}^{avg}$ and the use of a feedback signal in this embodiment is for illustrative purposes only.

Figure 2:
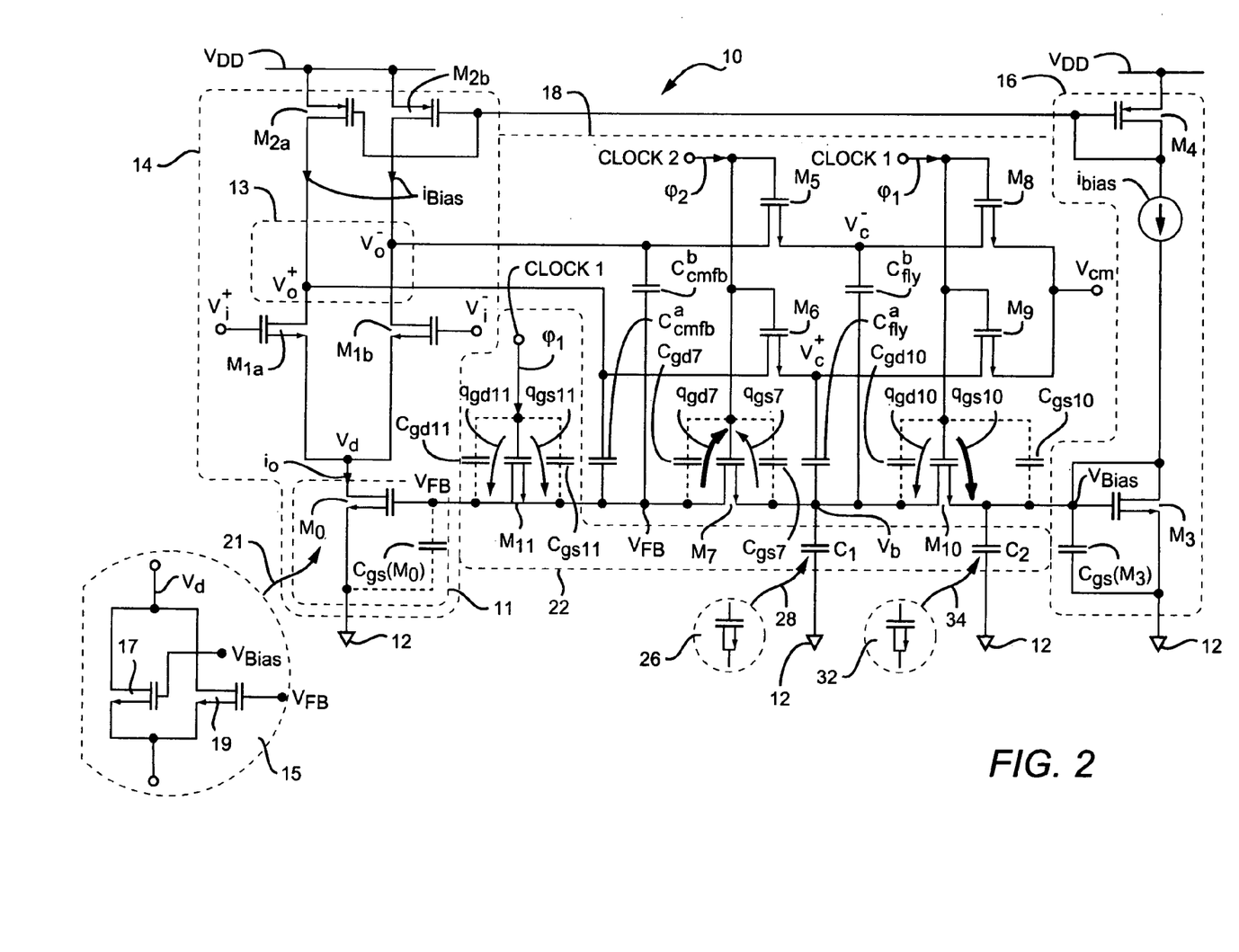
FIG. 2 is a simplified circuit schematic diagram of the signal conditioning system illustrated in FIG. 1.

FIG. 2. illustrates a simplified circuit schematic diagram of one embodiment of signal conditioning system 10 illustrated in FIG. 1. In this embodiment, common-mode circuit 14 includes n-MOS transistors $M_{1a}$ and $M_{1b}$ connected as a differential amplifier pair. Further, output port 13 is provided by the drains of transistors $M_{1a}$ and $M_{1b}$, which form differential output terminals $V_o^+$ and $V_o^-$. A power source $V_{DD}$ is coupled to transistors $M_{1a}$ and $M_{1b}$ through p-MOS transistors $M_{2a}$ and $M_{2b}$, respectively. Transistors $M_{2a}$ and $M_{2b}$ each include a control terminal coupled to biasing circuit 16 and provide a biasing current equal to $i_{bias}/2$ to respective transistors $M_{1a}$ and $M_{1b}$.

A current sinking portion 11 includes a current sinking n-MOS transistor $M_0$ that sinks a current $i_0$ from transistors $M_{1a}$ and $M_{1b}$ to current return 12. Transistor $M_0$ includes a drain coupled to the sources of transistors $M_{1a}$ and $M_{1b}$ through a terminal $V_d$ and a source connected to a current return 12. Further, a control terminal of transistor $M_0$ is connected to common-mode corrector circuit 18 and error correcting circuit 22 at terminal $V_{FB}$.

It should be -noted that current sinking portion 11 can include more than one transistor in some embodiments. This is exemplified in FIG. 2 by current sink 15 which includes parallel n-MOS transistors 17 and 19. The control terminal of transistor 19 is connected to terminal $V_{FB}$ while the control terminal of transistor 17 is connected to terminal $V_{bias}$. Current sink 15 can be substituted for current sinking portion 11 as indicated by substitution arrow 21.

The embodiment with current sink 15 may be desired to adjust the operating characteristics of common-mode circuit 14. The number of parallel transistors determines the gate capacitance of current sinking portion 11 and the operating frequency of circuit 14. However, only one transistor is illustrated in current sinking portion 11 for simplicity and ease of discussion.

In accordance with the invention, bias circuit 16 includes a diode connected n-MOS transistor $M_3$ where the source is coupled to reference potential 12 and the drain is coupled to a current source $I_{bias}$ which provides current $i_{bias}$. Current source $I_{bias}$ is also coupled to the drain of a diode connected p-MOS transistor $M_4$ where the source of transistor $M_4$ is coupled to power supply $V_{DD}$ and the control terminal is coupled to the control terminals of transistors $M_{2a}$ and $M_{2b}$.

In operation, transistor $M_4$ is configured to mirror bias current $i_{bias}$ to transistors $M_{2a}$ and $M_{2b}$. Further, transistor $M_3$ is configured to provide a bias signal $v_{bias}$ at a terminal $V_{bias}$ connected to a control terminal of transistor $M_3$. It should be noted that signal $v_{bias}$ is used to bias transistor $M_0$ through common-mode corrector circuit 18 and error correcting circuit 22 and, consequently, signal $v_{bias}$ determines the amount of current sunk (i.e. current $i_0$) by transistor $M_0$.

In this embodiment, current return 12 can include a voltage terminal with a reference potential. However, in the embodiment illustrated in FIG. 2, current return 12 is illustrated as a ground terminal (i.e. AC and DC ground), with the potential difference between current return 12 and power supply $V_{DD}$, connected to the sources of transistors $M_{2a}$, $M_{2b}$, and $M_4$, driving system 10.

It should also be noted that above and in the following discussion, the polarity of the various transistors included in system 10 can be changed from n-MOS to p-MOS or from p-MOS to n-MOS. Further, system 10 can include bipolar junction transistors or other types of field effect transistors. Hence, the type and the polarity of the transistors included in system 10 are chosen for simplicity and ease of discussion and are not meant to limit the scope of the invention.

In this embodiment, common-mode corrector circuit 18 includes a switched capacitor network. In particular, common-mode corrector circuit 18 includes a switch $M_{10}$ coupled between terminal $V_{bias}$ and a terminal $V_b$. Further, terminal $V_{cm}$ is coupled to terminals $V_c^+$ and $V_c^-$ through switches $M_8$ and $M_9$, respectively.

In accordance with the invention, terminal $V_c^-$ is coupled to terminal $V_o^-$ through a switch $M_5$ and terminal $V_c^+$ is coupled to terminal $V_o^+$ through a switch $M_6$. Further, terminal $V_b$ is coupled to terminal $V_{FB}$ through a switch $M_7$. A precharging capacitor $C_{fly}^a$ is connected between terminals $V_b$ and $V_c^+$ and a precharging capacitor $C_{fly}^b$ is connected between terminals $V_b$ and $V_c^-$. Further, a common-mode feedback capacitor $C_{cmfb}^a$ is connected between terminals $V_{FB}$ and $V_o^+$ and a common-mode feedback capacitor $C_{cmfb}^b$ is connected between terminals $V_{FB}$ and $V_o^-$. It should be noted that precharging capacitors $C_{fly}^a$ and $C_{fly}^b$ are often referred to as "flying" capacitors because they are configured to provide charge storage and charge transfer in response to alternating phases or operational modes.

In this embodiment, error correcting circuit 22 includes a switch $M_{11}$, coupled between common-mode corrector circuit 18 and the control terminal of current sinking transistor $M_0$. Circuit 22 further includes a balancing capacitor $C_1$ and a balancing capacitor $C_2$ coupled between reference potential 12 and terminals $V_b$ and $V_{bias}$, respectively. It should be noted that the source and drain of switch $M_{11}$ are connected together so that switch $M_{11}$ is configured to behave as a "dummy" switch, as will discussed in more detail below.

In some embodiments, at least one of charge balancing capacitors $C_1$ and $C_2$ can include a transistor such as a MOS transistor. This realization is exemplified in FIG. 2 by MOS transistors 26 and 32 which are substituted for charge balancing capacitors $C_1$ and $C_2$, respectively, as indicated by respective substitution arrows 28 and 34.

In this embodiment, switches $M_5$ through $M_{11}$ include n-MOS transistors with gates coupled to alternately switching clocks. In particular, the gates of switches $M_8$, $M_9$, $M_{10}$, and $M_{11}$ are coupled to a clock 1 which provides a clock signal $\phi_1$ and the gates of switches $M_5$, $M_6$, and $M_7$ are coupled to a clock 2 which provides a clock signal $\phi_2$. It should be noted that clocks 1 and 2 correspond to output signal phases or operational modes which can be provided by phase coupled clock signals. For example, clocks 1 and 2 can provide respective signals $\phi_1$ and $\phi_2$ which include non-overlapping square clock pulses.

In operation, signal $v_{cm}^{avg}$ is formed by transistors $M_0$, $M_{1a}$, $M_{1b}$, $M_{2a}$ and $M_{2b}$ and is set by the difference between the currents sourced by transistors $M_{2a}$ and $M_{2b}$ (i.e. current $i_{bias}$) and the current sunk by transistor $M_0$ (i.e. current $i_0$). The sum of the currents sourced by $M_{2a}$ and $M_{2b}$ can be different from current $i_0$ because of processing variations in the various components included in common-mode circuit 102 (i.e. transistors $M_{1a}$, $M_{1b}$, $M_{2a}$, and $M_{2b}$) and temperature and power supply variations.

Processing variations correspond to chip-to-chip differences that occur when fabricating a large number of chips. It is well known that in a fabrication run some chips will have a higher maximum operating frequency (i.e. a fast process) or a lower maximum operating frequency (i.e. a slow process) than a desired operating frequency because of physical variations (i.e. variations in gate area, film thickness, doping concentration, etc.) in the elements included in system 10. For example, physical variations can be caused because transistors $M_{2a}$ and $M_{2b}$ are p-MOS transistors which are typically fabricated during a different step from n-MOS transistors $M_0$, $M_{1a}$, $M_{1b}$, $M_3$, and $M_4$.

Temperature variations can be caused by the environment surrounding system 10 and power supply variations can include voltage changes in power source $V_{DD}$. Controlling variations in power source $V_{DD}$ is desirable because circuits are being scaled to lower operating voltages for portable and other applications. For example, in some embodiments power source $V_{DD}$ can be a battery which typically discharges over time. In other embodiments, variations in power source $V_{DD}$ can be from the imperfect regulation of power source $V_{DD}$ in line powered applications.

The balancing of signal $v_{cm}^{avg}$ with signal $v_{cm}$ occurs when common-mode corrector circuit 18 couples output terminals $V_o^+$ and $V_o^-$ to the gate of current sinking transistor $M_0$ to adjust a gate bias of transistor $M_0$ in response to the difference between signals $V_{cm}^{avg}$ and $v_{cm}$. The coupling is proportional to feedback signal $V_{FB}$ and controls or drives the common-mode signal $v_{cm}^{avg}$ to equal signal $V_{cm}$.

In operation, when signal $\phi_1$ is high and signal $\phi_2$ is low (i.e. switches $M_8$, $M_9$, $M_{10}$, and $M_{11}$ are on and switches $M_5$, $M_6$, and $M_7$ are off), charge proportional to the difference between signals $v_{cm}$ and $v_{bias}$ is stored on capacitors $C_{fly}^a$ and $C_{fly}^b$. Further, when signal $\phi_1$ is low and signal $\phi_2$ is high (i.e. switches $M_8$, $M_9$, $M_{10}$, and $M_{11}$ are off and switches $M_5$, $M_6$, and $M_7$ are on) the charge stored on capacitors $C_{fly}^a$ and $C_{fly}^b$ is transferred to capacitors $C_{cmfb}^a$ and $C_{cmfb}^b$, respectively. Hence, signals $v_{cm}^{avg}$ and $v_{cm}$ can be compared by alternately clocking the group of switches including $M_5$ through $M_7$ and the group of switches including $M_8$ through $M_{11}$.

It should also be noted that in this embodiment the gate of switch $M_{11}$, is coupled to clock 1 because common-mode circuit 14 is inactive when signal $\phi_2$ is high and signal $\phi_1$ is low. In particular, circuit 14 is typically inactive when switches $M_5$, $M_6$, and $M_7$ are on because circuit 14 is configured for operation in a switched capacitor environment so that transistors $M_{1a}$ and $M_{1b}$ are active during a system transfer mode when switches $M_8$, $M_9$, $M_{10}$, and $M_{11}$ are on. In other embodiments, circuit 14 can be active when either $\phi_1$ or $\phi_2$ are high to provide amplifier sharing.

An example of the common-mode error gain can be illustrated when signal $\phi_1$ is high and signal $\phi_2$ is low. If an error signal is sensed (i.e. the common-mode variation is not equal to zero) by the control terminal of transistor $M_0$, then there will be a high gain between signal $V_{FB}$ and the common-mode signal at output terminals $V_o^+$ and $V_o^-$. The error signal will be scaled by a value that is proportional to the ratio of capacitance $c_{gs}(M_0)$ divided by the sum of capacitances $c_{cmfb}^a$ and $c_{cmfb}^b$ where $c_{gs}(M_0)$ is the total capacitance, including parasitic capacitances, between the control terminal and source of transistor $M_0$. However, when signal $\phi_1$ is low and signal $\phi_2$ is high, the error signal is scaled by a factor proportional to capacitance $c_{gs}(M_0)$ divided by the sum of capacitances $C_{cmfb}^a$, $c_{cmfb}^b$, $c_{fly}^a$, and $C_{fly}^b$.

The change in the common-mode error gain when switching between signals $\phi_1$, and $\phi_2$ causes "charge hopping" where signal $V_{cm}^{avg}$ is a function of both signals $\phi_{1\ l\ and\ \phi 2}$. Hence, the common-mode error gain depends on parasitic capacitances and the common-mode variations caused by phase-to-phase gain variations depend on capacitances $c_{fly}^a$ and $C_{fly}^b$.

Charge injection errors can be caused by currents flowing through parasitic capacitances of the transistors and switches included in system 10. Charge injection errors can also be caused by changes in the channel charge under a transistor gate as the transistor switches between the off and on state. It should be noted that the parasitic capacitances allow a control signal at a control terminal or gate of a transistor to be coupled to a corresponding transistor source or drain, the coupling resulting in a parasitic charge or current flow. The control signal coupling is referred to as feedthrough and occurs when charge is injected between the gate and the source or drain.

The parasitic capacitances illustrated in FIG. 2 are shown in phantom by indicating the relevant component with broken lines. For example, switch $M_7$ has a parasitic gate to drain capacitance $c_{gd7}$ with an injected charge $q_{gd7}$ and a parasitic gate to source capacitance $c_{gs7}$ with an injected charge $q_{gs7}$. Further, switch $M_{10}$ has a parasitic gate to drain capacitance $c_{gd10}$ with an injected charge $q_{gd10}$ and a parasitic gate to source capacitance $c_{gs10}$ with an injected charge $q_{gs10}$. Switch $M_{11}$ has a parasitic gate to drain capacitance $c_{gd11}$ with an injected charge $q_{gd11}$ and a parasitic gate to source capacitance $c_{gs11}$ with an injected charge $q_{gs11}$ and transistor $M_3$ has parasitic gate capacitance $c_{gs}(M_3)$. It should be noted that the injected charge corresponds to electrons where it is conventional to define positive current flow to be in a direction opposite to the direction of electron flow.

If capacitors $C_1$ and $C_2$ are excluded from system 10, then the impedance to reference potential 12 for terminals $V_b$, $V_{FB}$, and $V_{bias}$, will depend on the impedances through parasitic capacitors $C_{gs}(M_0)$ $C_{gs}(M_3)$, $C_{gs7}$, $C_{gd7}$, $C_{gd10}$, and $C_{gs10}$. By including capacitors $C_1$ and $C_2$ in system 10, however, the impedance to reference potential 12 for terminals $V_b$, $V_{FB}$, and $V_{bias}$ will depend more on the impedances through capacitors $C_1$ and $C_2$ and less on the parasitic impedances and, consequently, will be more constant as a function of time.

In accordance with the invention, the common-mode error gain and the charge injection errors can be minimized by configuring common-mode error correcting circuit 22. In particular, capacitances $c_1$ and $c_2$ can be chosen to reduce the charge injection error and the variations in the common-mode error gain by setting the impedance to reference potential 12 for terminals $V_{FB}$, $V_b$, and $V_{bias}$ to a desired value. Further, switch $M_{11}$ can be configured to reduce the charge injection error by selecting capacitances $c_{gs11}$ and $c_{gd11}$ so that the charge injection is balanced between MO and common-mode corrector circuit 18.

In this embodiment, switch $M_{11}$ is configured by choosing its gate area to be proportional to the gate area of switch $M_7$. For example, when switch $M_{11}$ is "half-sized", then its gate area is one-half the size of the gate area of switch $M_7$. Similarly, when switch $M_{11}$ is "full sized", then its gate area is equal to the gate area of switch $M_7$ and when switch $M_{11}$ is "three-quarters sized", then its gate area is three-quarters the size of the gate area of switch $M_7$.

Capacitors $C_1$ and $C_2$ provide impedance matching between terminals $V_b$ and $V_{Bias}$ and adjacent terminals such as terminal $V_{FB}$. Hence, capacitances $c_1$ and $c_2$ can be chosen to match an impedance of terminal $V_b$ to an impedance of terminal $V_{bias}$ when switching between signals $\phi_1$ and $\phi_2$. When terminals $V_b$ and $V_{bias}$ are impedance matched with the rest of system 10, an equal or balanced charge is transferred between terminals $V_b$ and $V_{bias}$ and each adjacent terminal when clocking switches $M_5$ through $M_{11}$.

When choosing capacitances $c_1$ and $c_2$, the common-mode error gain when signal $\phi_1$ is high is proportional to capacitance $c_{gs}(M_0)$ divided by the sum of capacitances $c^{cmfba}$ and $c_{cmfb}^b$. Further, the common-mode error gain when signal $\phi_2$ is high is proportional to the sum of capacitances $c_{gs}(M_0)$ and $c_1$ divided by the sum of capacitances $c_{cmfb}^a$, $c_{cmfb}^b$, $c_{fly}^a$, $c_{fly}^b$. Thus, for the common-mode error gain to remain constant, the error gain when signal $\phi_1$ is high should be equal to the error gain when signal $\phi_2$ is high so that:

$$\frac{c_{gs}(M_0)}{(c_{cmfb}^a + c_{cmfb}^b)} = \frac{(c_{gs}(M_0) + c_1)}{(c_{cmfb}^a + c_{cmfb}^b + c_{fly}^a + c_{fly}^b)}. \quad (1)$$

A solution to Equation (1) can be obtained when capacitances $c_{gs}$ ($M_0$) and $c_1$ are equal and when capacitance $c_{cmfb}^a$ equals capacitance $c_{fly}^a$ and capacitance $c_{cmfb}^b$ equals capacitance $c_{fly}^b$ so that:

$$\frac{c_{gs}(M_0)}{(c_{cmfb}^a + c_{cmfb}^b)} = \frac{2c_1}{2(c_{fly}^a + c_{fly}^b)} = \frac{c_1}{(c_{fly}^a + c_{fly}^b)}. \quad (2)$$

It should be noted that in some embodiments without capacitance $c_1$ in Equation (1), capacitances $c_{fly}^a$ and $c_{fly}^b$ would need to be smaller in order to decrease the common-mode variations when switching between signals $\phi_1$ and $\phi_2$. For example, in some designs, capacitances $c_{fly}^a$ and $c_{fly}^b$ are chosen to be equal to capacitances $c_{cmfb}^a/10$ and $c_{cmfb}^b/10$, respectively. However, when capacitances $c_{fly}^a$ and $c_{fly}^b$ are made smaller it takes more time to correct for the common-mode variation because it will take more clock cycles to move charge from terminals $V_{cm}$ and $V_{bias}$ to capacitors $C^{cmfba}$ and $C_{cmfb}^b$. Hence, it is desirable to increase capacitances $C_{fly}^a$ and $C_{fly}^b$ to increase the charge transfer rate from terminals $V_{cm}$ and $V_{bias}$ to capacitors $C_{cmfb}^a$ and $C_{cmfb}^b$ so that it takes less time (i.e. fewer clock cycles) to drive signal $v_{cm}^{avg}$ to $v_{cm}$.

Figure 3:
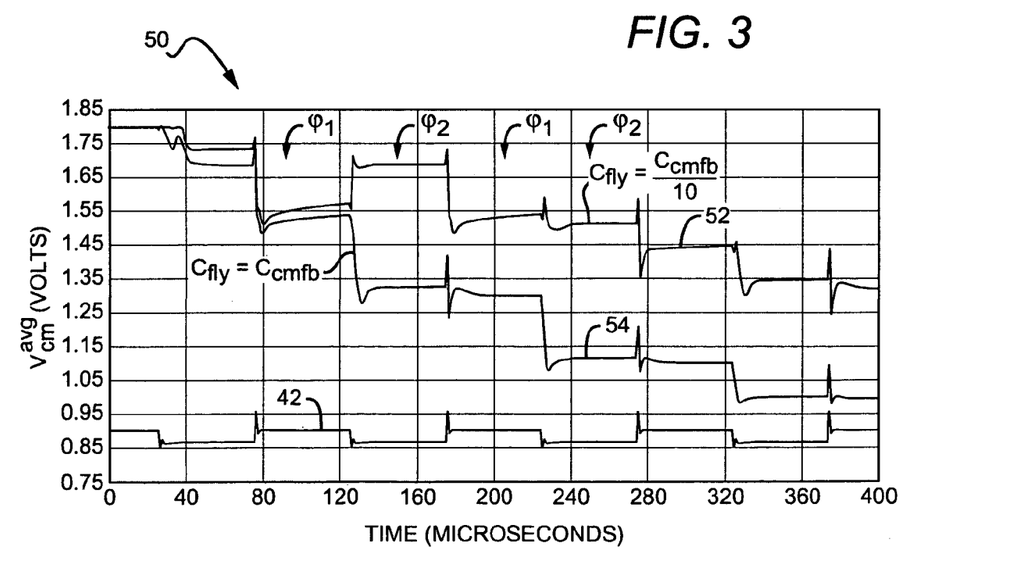
FIG. 3 is a graph illustrating a common-mode signal of the circuit illustrated in FIG. 2 as a function of time for capacitances $c_{fly}^a$ and $c_{fly}^b$ equal to $c_{cmfb}^a/10$ and $c_{cmfb}^b/10$, respectively, and capacitances $c_{fly}^a$ and $c_{fly}^b$ equal to $c_{cmfb}^a$ and $c_{cmfb}^b$, respectively.

FIG. 3 illustrates a graph 50 of signal $v_{cm}^{avg}$ of system 10 verses time for two different values of capacitances $c_{fly}^a$ and $c_{fly}^b$. A curve 52 corresponds to the case where capacitances $c_{fly}^a=c_{cmfb}^a/10$, $c_{fly}^b=c_{cmfb}^b/10$, and $c_{gs}$ ($M_0$)=$c_1$ and a curve 54 corresponds to the case where capacitances $c_{fly}^a=c_{cmfb}^a$, $c_{fly}^b=c_{cmfb}^b$ and $c_{gs}$ ($M_0$)=$c_1$. Also shown in FIG. 3 is a curve 42 that corresponds to a steady-state condition in which system 10 does not include capacitors $c_1$ and $c_2$ or switch $M_{11}$ and capacitances $c_{fly}^a=c_{cmfb}^a/10$ and $c_{fly}^b=c_{cmfb}^b/10$. In this example, the desired common-mode signal $v_{cm}$ is 850 mV or 0.850 volts, although signal $v_{cm}$ can be chosen to be another desired value.

As shown in FIG. 3, the common-mode signal can be corrected to the desired common-mode signal faster when capacitances $c_{fly}^a$ and $c_{fly}^b$ are larger (i.e. curve 54) because curve 54 converges to curve 42 quicker than curve 52. Hence, capacitors $C_{fly}^a$ and $C_{fly}^b$ can transfer more charge in a given time from terminal $V_{cm}$ to capacitors $C_{cmfb}^a$ and $C_{cmfb}^b$, respectively.

Hence, one advantage of using capacitor $C_1$ is that capacitances $c_{fly}^a$ and $c_{fly}^b$ can be increased by choosing a value for capacitor $C_1$ so that Equation (2) is satisfied. For example, capacitances $c_{fly}^a$ and $c_{fly}^b$ can be made equal to capacitances $c_{cmfb}^a$ and $c_{cmfb}^b$, respectively, and capacitance $c_g(M_0)$ can be equal to capacitance $c_1$.

It is anticipated that capacitance $c_{fly}^a$ can be within a range between one half to one times a capacitance of $c^{cmfba}$ and that capacitance $c_{fly}^b$ can be within a range between one half to one times a capacitance $c_{cmfb}^b$ to minimize common-mode variations and to maximize the charge transfer rate. It should be noted, however, that capacitances $c_{fly}^a$ and $c_{fly}^b$ can have values outside these ranges in other embodiments.

Capacitances $c_1$ and $c_2$ can be chosen to balance the parasitic currents injected by switches $M_7$ and $M_{10}$ and transistors $M_0$ and $M_3$ to minimize the charge injection errors. As an example, if bias circuit 16 has a medium impedance through capacitor $c_{gs}$ ($M_3$) common-mode circuit 14 has a low impedance through capacitor $c_{gs}$ ($M_0$), and terminal $V_b$ has a high impedance to current return 12, then charges will preferentially flow towards terminal $V_{bias}$ when signal $\phi_1$ goes high and signal $\phi_2$ goes low.

Hence, when signal $\phi_1$ goes low and signal $\phi_2$ goes high, the magnitude of charge $q_{gs11}$ will be equal to charge $q_{gd11}$ because the source and drain of switch $M_{11}$ are connected together (i.e. switch $M_{11}$ is a dummy switch). The magnitude of charge $q_{gd7}$ will be greater than charge $q_{gs7}$ and the magnitude of charge $q_{gd10}$ will be less than charge $q_{gs10}$. Charge $q_{gd7}$ can be made equal to $q_{gs11}+q_{gd11}$ by sizing switch $M_{11}$ to have an area and width equal to one-half of the area and width of switch $M_7$ and by choosing the impedance between reference potential 12 and terminals $V_{FB}$ and $V_b$ to be equal. The relative magnitudes of the injected charges are indicated by the size of the arrows representing the corresponding charges. Further, the directions of the arrows indicate that most of the charge flow will be towards terminal $V_{bias}$.

As another example, if signal $\phi_1$ goes low and signal $\phi_2$ goes high, then the magnitude of charge $q_{gs11}$ will be equal to charge $q_{gd11}$, the magnitude of charge $q_{gd7}$ will be greater than charge $q_{gs7}$, and the magnitude of charge $q_{gd10}$ will be less than charge $q_{gs10}$. Further, the direction of the corresponding arrows will be the opposite as that indicated in FIG. 2 because most of the charge will flow away from terminal $V_{bias}$.

If terminal $V_{bias}$ has the same impedance through capacitor $c_{gs}$ ($M_3$) as capacitor $c_{gs}$ ($M_0$), however, then the magnitudes of the injected charge flow will be the same through the parasitic capacitances because the impedances will be equal or balanced. Hence, the size of the arrows representing the charge flow will be equal.

The charge or current balancing of the injected charges provides less common-mode variations and gain errors. To provide minimal common-mode gain and charge injection errors, it is anticipated that capacitances $c_1$ and $c_{gs}$ ($M_0$) can be equal so that the injected charge is balanced or split evenly between terminals $V_b$ and $V_{FB}$. It is also anticipated that the sum of capacitances $c_{gs}$ ($M_3$) and $c_2$ can be equal to capacitance $c_{gs}$ ($M_0$) so that charge is balanced or split evenly between terminals $V_b$ and $V_{bias}$.

The common-mode variation can be illustrated by considering the following examples. It should be noted that in these examples, the desired common-mode level $v_{cm}$ is equal to 850 mV and the graphs show the value of signal $v_{cm}^{avg}$ as a function of time or clock signals $\phi_1$ and $\phi_2$. In the following examples, it is typically desired to have signal $v_{cm}^{avg}$ equal to signal $v_{cm}$ and to have signal $v_{cm}^{avg}$ be the same when switching between clocks 1 and 2.

If signal $v_{cm}^{avg}$ is the same when switching between clocks 1 and 2, then $V_{cm}^{avg}$ when clock 1 is high (i.e. $v_{cm}^{avg}(\phi_1)$) will be equal to $v_{cm}^{avg}$ when clock 2 is high (i.e. $v_{cm}^{avg}(\phi_2)$). Hence, a measure of the common-mode variations and the error gain for various configurations of error correcting circuit 22 can be determined by comparing the difference and the average of signals $v_{cm}^{avg}$ ($\phi_1$) and $v_{cm}^{avg}$ (($\phi_2$) where, in these examples, the average should be 850 mV.

Figure 4:
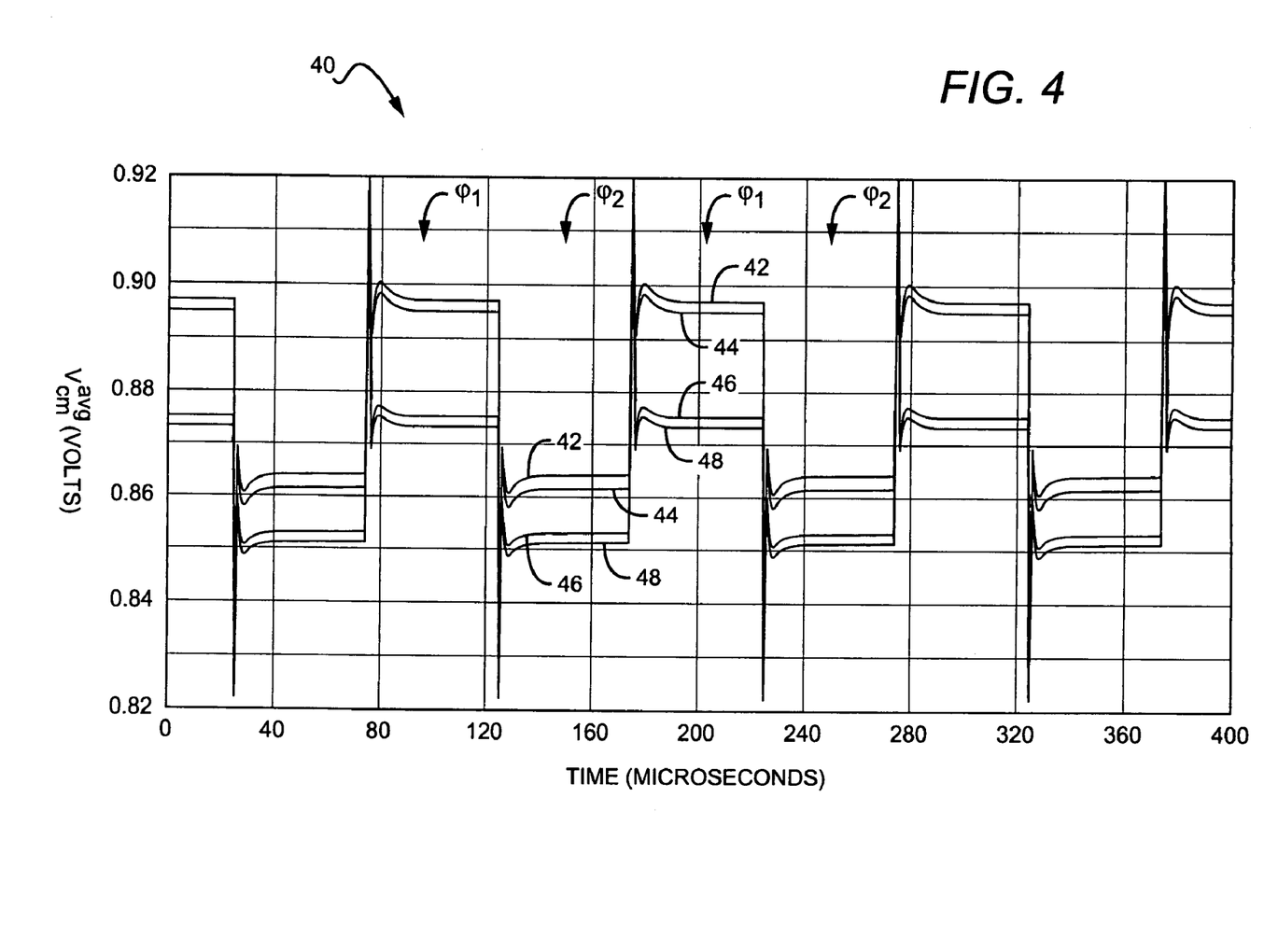
FIG. 4 is a graph illustrating the common-mode signal of the circuit illustrated in FIG. 2 as a function of time for different configurations of capacitors $C_1$ and $C_2$.

FIG. 4 illustrates a graph 40 of signal $v_{cm}^{avg}$ of system 10 verses clocks signals $\phi_1$ and $\phi_2$. In FIG. 4, curve 42 corresponds to signal $v_{cm}^{avg}$ without balancing capacitors $C_1$ and $C_2$ or switch $M_{11}$. A curve 44 corresponds to signal $v_{cm}^{avg}$ with capacitor $C_2$ and without both capacitor $C_1$ and switch $M_{11}$. A curve 46 corresponds to signal $v_{cm}^{avg}$ with capacitor $C_1$ and without both capacitor $C_2$ and switch $M_{11}$. A curve 48 corresponds to signal $v_{cm}^{avg}$ with both capacitors $C_1$ and $C_2$ and without switch $M_1$.

The common-mode variation and the average variation between clock signals $\phi_1$ and $\phi_1$ for curves 42, 44, 46, and 48 are shown in Table 1. It can be seen from Table 1 and graph 40 that capacitances $c_1$ and $c_2$ shift curve 42 towards the desired common-mode signal $v_{cm}$ (i.e. 850 mV) where capacitor $C_1$ has slightly more of an affect than capacitor $C_2$ because it is shifted closer to 850 mV. When capacitors $C_1$ and $C_2$ are both included, the common-mode level is shifted even closer to 850 mV. Hence, capacitors $C_1$ and $C_2$ can reduce the difference between $v_{cm}^{avg}(\phi_1)$ and $v_{cm}^{avg}$ ($\phi_2$) and move the average of signals $v_{cm}^{avg}(\phi_1)$ and $v_{cm}^{avg}$ ($\phi_2$) closer to 850 mV.

TABLE 1

Common-mode variations for graph 40.

| Graph 40 | | $v_{cm}^{avg}(\varphi_1)$ | $v_{cm}^{avg}(\varphi_2)$ | $v_{cm}^{avg}(\varphi_1) - v_{cm}^{avg}(\varphi_2)$ | $\frac{v_{cm}^{avg}(\varphi_1) + v_{cm}^{avg}(\varphi_2)}{2}$ |
|---|---|---|---|---|---|
| Curve 42 | | 897 mV | 863 mV | 350 mV | 880 mV |
| Curve 44 | $C_2$ | 896 mV | 861 mV | 350 mV | 879 mV |
| Curve 46 | $C_1$ | 875 mV | 853 mV | 220 mV | 864 mV |
| Curve 48 | $C_1, C_2$ | 873 mV | 851 mV | 220 mV | 862 mV |

Figure 5:
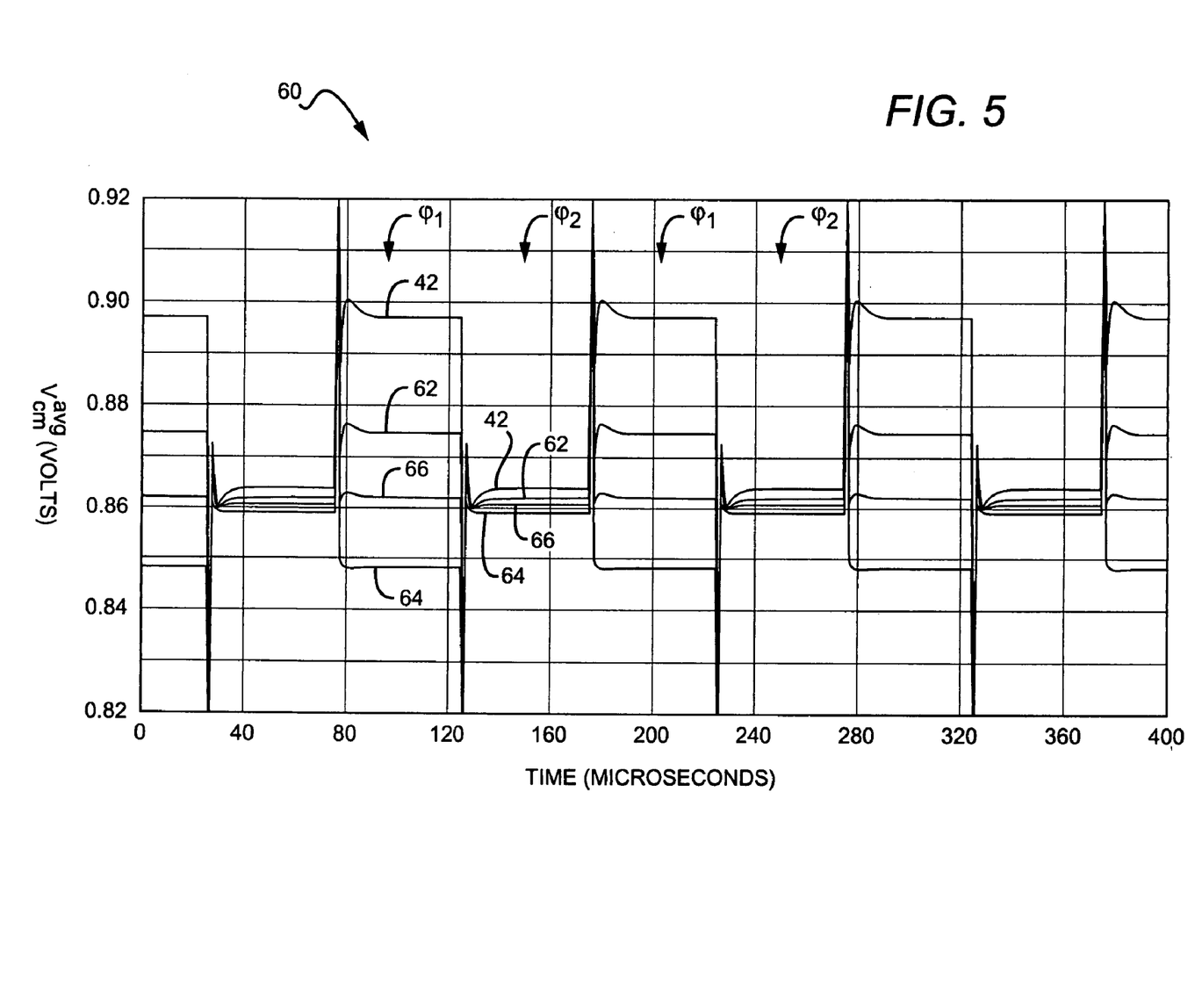
FIG. 5 is a graph illustrating the common-mode signal of the circuit illustrated in FIG. 2 as a function of time for different configurations of switch $M_{11}$.

FIG. 5 illustrates a graph 60 of signal $v_{cm}^{avg}$ of system 10 verses clock signals $\phi_1$ and $\phi_2$. In FIG. 5, a curve 62 corresponds to signal $v_{cm}^{avg}$ with a half-sized switch $M_{11}$, a curve 64 corresponds to signal $v_{cm}^{avg}$ with a full-sized switch $M_{11}$, and a curve 66 corresponds to signal $v_{cm}^{avg}$ with a three-quarters sized switch $M_{11}$. It should be noted that capacitors $C_1$ and $C_2$ are not included in system 10 for the curves in FIG. 5 to illustrate the effects of switch $M_{11}$.

The common-mode variation and the average variation between clocks $\phi_1$ and $\phi_1$ for curves 42, 62, 64, and 66 are shown in Table 2. It can be seen from Table 2 and graph 62 that adding switch $M_{11}$ shifts curve 42 toward the desired common-mode signal $v_{cm}$ (i.e. 850 mV) and decreases the common-mode gain errors (i.e. $v_{cm}^{avg}(\phi_1)-v_{cm}^{avg}(\phi_2)$) between clocks $\phi_1$ and $\phi_2$. As the area of switch $M_{11}$ in increased to a three-quarters sized switch, signal $v_{cm}^{avg}(\phi_1)$ approaches $v_{cm}^{avg}(\phi_2)$. For a full-sized switch, $v_{cm}^{avg}(\phi_1)$ becomes less than $v_{cm}^{avg}(\phi_2)$ indicating that the optimum size in some embodiments is between a three-quarters sized switch and a full-sized switch. Hence, when switch $M_{11}$ is three-quarters sized, the common-mode gain error is less than the full-sized and half-sized cases (see curve 66). Thus, by optimizing the size of switch $M_{11}$, the difference between $v_{cm}^{avg}(\phi_1)$ and $v_{cm}^{avg}(\phi_2)$ can be reduced and the average of signals $v_{cm}^{avg}(\phi_1)$ and $v_{cm}^{avg}(\phi_2)$ can be moved closer to 850 mV.

without significantly degrading the performance. One cause of performance degradation is an increased variation in the common-mode levels.

TABLE 2

Common-mode variations for graph 60.

| Graph 60 | | $v_{cm}^{avg}(\varphi_1)$ | $v_{cm}^{avg}(\varphi_2)$ | $v_{cm}^{avg}(\varphi_1) - v_{cm}^{avg}(\varphi_2)$ | $\dfrac{v_{cm}^{avg}(\varphi_1) + v_{cm}^{avg}(\varphi_2)}{2}$ |
|---|---|---|---|---|---|
| Curve 42 | | 897 mV | 863 mV | 350 mV | 880 mV |
| Curve 62 | Half size | 874 mV | 861 mV | 13 mV | 868 mV |
| Curve 64 | Full size | 847 mV | 858 mV | −11 mV | 853 mV |
| Curve 66 | ¾ size | 862 mV | 860 mV | 2 mV | 861 mV |

In a typical manufacturing process, a circuit can be fabricated on a large number of individual substrates. It is well known that variations in the performance of the circuit can occur from one substrate to another where, in general, the variations are caused by variations in the semiconductor processing. For example, a particular film, such as an oxide or a conductive material, can be thicker on one substrate compared to another. The doping density can also vary throughout the manufacturing process which can affect the number of carriers in a particular region.

Hence, processing variations can cause differences in the performance of system 10 when manufacturing copies of it on the same or separate substrates. For example, when testing a large number of circuits, an average or nominal performance will be obtained where some circuits can run at a higher maximum possible frequency and others can run at a lower maximum possible frequency. The performance can affect the values of the common-mode level and variation. The performance can also affect the range of values for the common-mode level and variation.

It is desired to have the common-mode level and variation constant from one circuit to another when fabricating a large number of circuits. It is also desired to have the range of values for the common-mode level and variation narrow so that the performance of each individual circuit will be approximately the same for all conditions.

The differences in performance due to processing variations can be represented by simulating system 10 using a "fast model" or a "slow model". The fast model represents the performance of system 10 when system 10 has be subject to processing variations that lead to a higher maximum possible operating frequency. The slow model represents the performance of system 10 when system 10 has been subject to processing variations that lead to a lower maximum possible operating frequency. It is generally desired to be able to operate system 10 at both high and low temperatures For this discussion, an operating temperature range between 125° C. and −40° C. is used as a benchmark where 125° C. is the expected highest operating temperature of system 10 and −40° C. is the expected lowest operating temperature. A temperature of 55° C. is used as the nominal temperature which represents the expected average operating temperature of system 10. It should be noted that these temperatures are chosen for illustrative purposes only and are not meant to limit the scope of the invention.

It should also be noted that in one embodiment, system 10 is fabricated with silicon-based circuitry. However, system 10 can be fabricated using other material systems. Examples of other material systems include III–V semiconductor materials, such as gallium arsenide, gallium nitride, or aluminum nitride. Other examples include germanium, silicon germanium, or silicon carbide.

Figure 6:
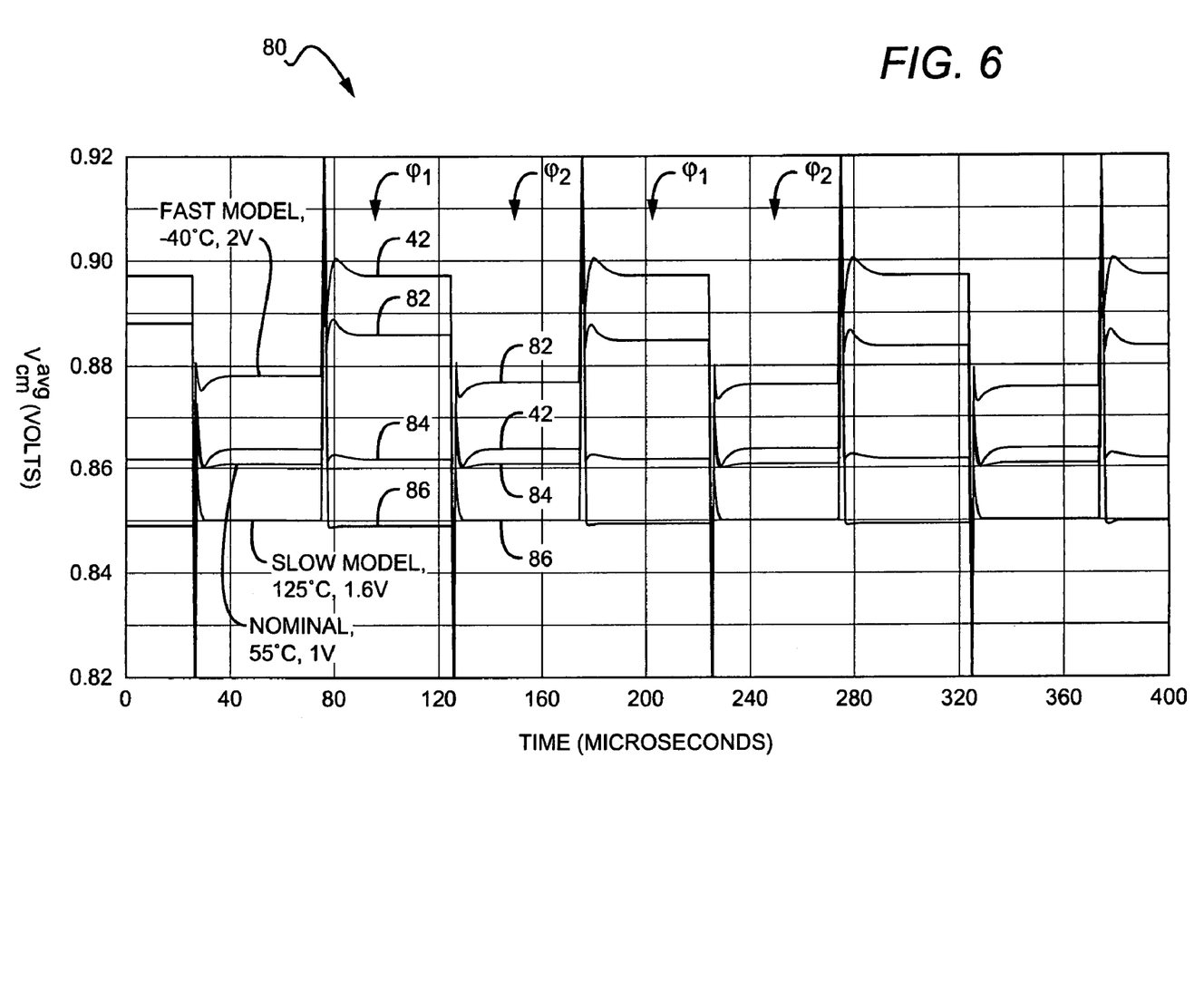
FIG. 6 is a graph illustrating the common-mode signal of the circuit illustrated in FIG. 2 as a function of time for different processing, power supply, and temperature conditions where switch $M_{11}$, is three-quarters sized and the circuit excludes capacitors $C_1$ and $C_2$.

FIG. 6 illustrates a graph 80 showing the effects of processing, power supply, and temperature variations for system 10 where capacitors $C_1$ and $C_2$ are excluded and switch $M_{11}$, is three-quarters sized.

In FIG. 6, a curve 82 corresponds to a fast process at a temperature of 125° C. where $V_{DD}$=2 volts. A curve 84 corresponds to the nominal process at a temperature of 55° C. where $V_{DD}$=1.8 volts and a curve 86 corresponds to a slow process at a temperature of −40° C. where $V_{DD}$=1.6 volts.

Curves 86 and 82 are chosen to represent the best and worst case responses, respectively, over process, power, and temperature variations and graph 84 represents the typical response under nominal or normal operating conditions.

For curve 86, the difference between signals $v_{cm}^{avg}(\phi_1)$ and $v_{cm}^{avg}(\phi_2)$ is about −2 mV and the average is around 849 mV. For curve 82, the difference between signals $v_{cm}^{avg}(\phi_2)$ and $_{cm}^{avg}(\phi_2)$ is about 10 mV and the average is around 883 mV. For curve 84, the difference between signals $v_{cm}^{avg}(\phi_1)$ and $v_{cm}^{avg}(\phi_2)$ is about 1 mV and the average is around 862 mV.

TABLE 3

Common-mode variations for graph 80.

| Graph 80 | | $v_{cm}^{avg}(\varphi_1)$ | $v_{cm}^{avg}(\varphi_2)$ | $v_{cm}^{avg}(\varphi_1) - v_{cm}^{avg}(\varphi_2)$ | $\dfrac{v_{cm}^{avg}(\varphi_1) + v_{cm}^{avg}(\varphi_2)}{2}$ |
|---|---|---|---|---|---|
| Curve 42 | | 897 mV | 863 mV | 350 mV | 880 mV |
| Curve 82 | Fast | 888 mV | 878 mV | 10 mV | 883 mV |
| Curve 84 | Nom. | 862 mV | 861 mV | 1 mV | 862 mV |
| Curve 86 | Slow | 848 mV | 850 mV | −2 mV | 849 mV |

The common-mode variations and the average variation between clock signals $\phi_1$ and $\phi_1$ for curves 42, 82, 84, and 86 are shown in Table 3. It can be seen from Table 3 and graph 80 that the average of $v_{cm}^{avg}$ for clock signals $\phi_1$ and $\phi_2$ is expected to be in a range from 883 mV to 849 mV when fabricating a large number of circuits. Further, when fabricating a large number of circuits, the difference between $v_{cm}^{avg}(\phi_1)$ and $v_{cm}^{avg}(\phi_2)$ is expected to be in a range from −2 mV to 10 mV.

Figure 7:
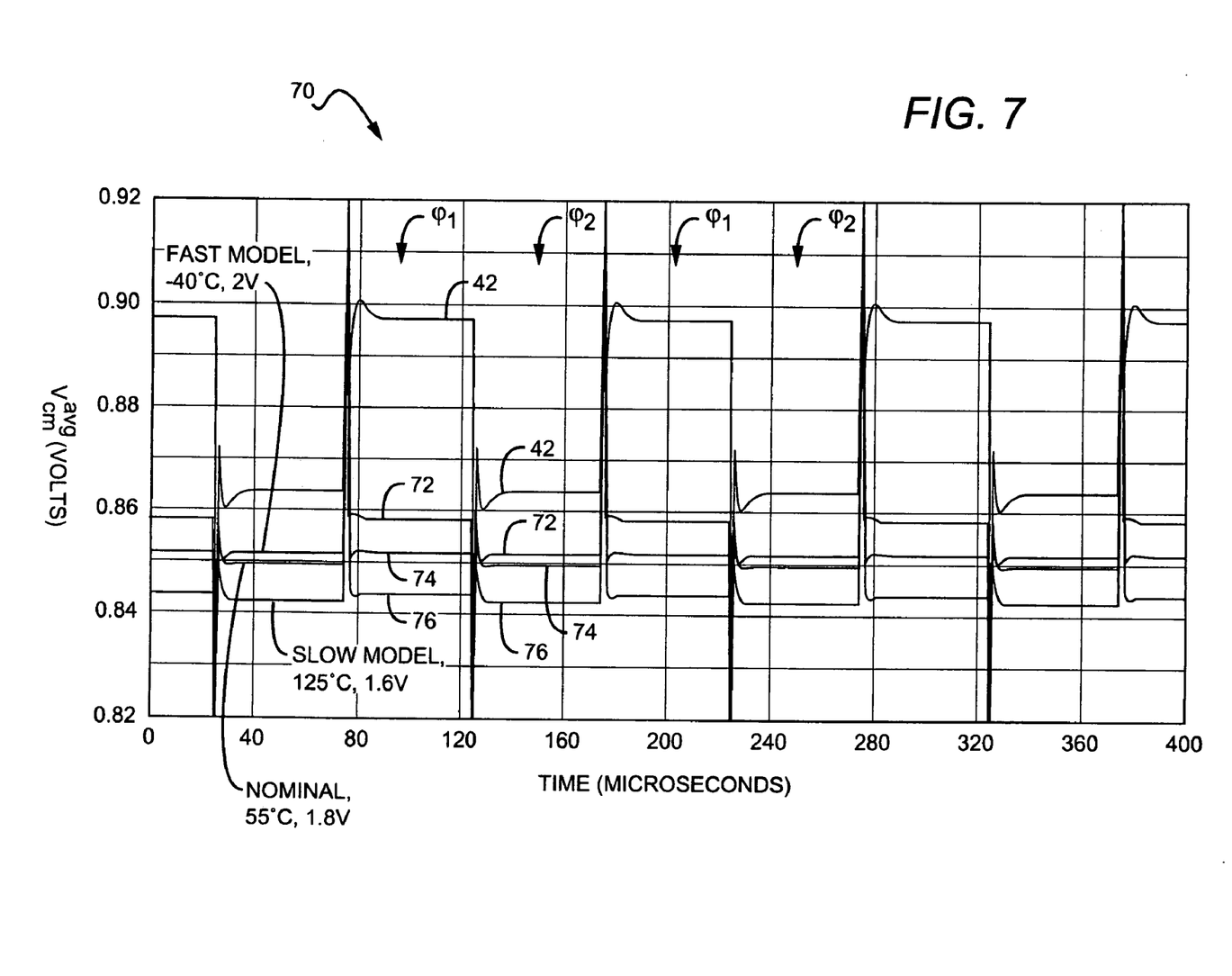
FIG. 7 is a graph illustrating the common-mode signal of the circuit illustrated in FIG. 2 as a function of time for different processing, power supply, and temperature conditions where switch $M_{11}$, is one-half sized and the circuit includes capacitors $C_1$ and $C_2$.

FIG. 7 illustrates a graph 70 of signal $v_{cm}^{avg}$ of system 10 verses clock signals $\phi_1$ and $\phi_2$ when system 10 includes capacitors $C_1$ and $C_2$ and switch $M_{11}$, where switch $M_{11}$, is one-half sized. A curve 72 corresponds to a fast process at a temperature of 125° C. where $V_{DD}$=2 volts. A curve 74 corresponds to the nominal process at a temperature of 55° C. where $V_{DD}$=1.8 volts. A curve 76 corresponds to a slow process at a temperature of −30° C. where $V_{DD}$=1.6 volts.

TABLE 4

Common-mode variations for graph 70.

| Graph 70 | | $v_{cm}^{avg}(\varphi_1)$ | $v_{cm}^{avg}(\varphi_2)$ | $v_{cm}^{avg}(\varphi_1) - v_{cm}^{avg}(\varphi_2)$ | $\dfrac{v_{cm}^{avg}(\varphi_1) + v_{cm}^{avg}(\varphi_2)}{2}$ |
|---|---|---|---|---|---|
| Curve 42 | | 897 mV | 863 mV | 350 mV | 880 mV |
| Curve 72 | Fast | 858 mV | 851 mV | 7 mV | 855 mV |
| Curve 74 | Nom. | 852 mV | 845 mV | 7 mV | 849 mV |
| Curve 76 | Slow | 844 mV | 842 mV | 2 mV | 843 mV |

The common-mode variation and the average common-mode variation between clock signals $\phi_1$ and $\phi_2$ for curves 42, 72, 74, and 76 are shown in Table 4. The values in Table 4 can be compared to the values in Table 3 to illustrate the improvement in the difference and the average of $v_{cm}^{avg}(\phi_1)$ and $v_{cm}^{avg}(\phi_2)$ when switching between clock signals $\phi_1$ and $\phi_2$. It can be seen from Table 4 and graph 70 that the average of $v_{cm}^{avg}$ for clock signals $\phi_1$ and $\phi_2$ is expected to be in a range from 855 mV to 843 mV when fabricating a large number of circuits. Further, when fabricating a large number of circuits, the difference between $v_{cm}^{avg}(\phi_1)$ and $v_{cm}^{avg}(\phi_2)$ is expected to be in a range from 2 mV to 7 mV.

Hence, by optimizing the area of switch $M_{11}$, and by including capacitors $C_1$ and $C_2$, the average of $v_{cm}^{avg}(\phi_1)$ and $v_{cm}^{avg}(\phi_2)$ can be closer to the desired value of 850 mV when fabricating a large number of circuits. Further, the difference between $v_{cm}^{avg}(\phi_1)$ and $v_{cm}^{avg}(\phi_2)$ can be significantly reduced. Thus, the effects of processing variations commonly found in the manufacturing process can be minimized so that each circuit will have a similar performance.

Thus, a circuit with a common-mode dual output has been disclosed. The circuit can include a common-mode circuit with an output portion coupled to a common-mode corrector circuit. An error correcting circuit is connected to the common-mode corrector circuit to improve the performance.

The error correcting circuit can include capacitors $C_1$ and $C_2$ and switch $M_{11}$ which can be configured to reduce variations in the common-mode level of the circuit when switching between two operational modes. Capacitors $C_1$ and $C_2$ and switch $M_{11}$ can also be configured to reduce the range of values for the common-mode level and variation when fabricating a large number of circuits. Further, by including capacitor $C_1$, capacitor $C_{fly}$ can be made larger so that the common-mode level can be corrected to the desired common-mode level with fewer clock cycles.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

What is claimed is:

1. A circuit with a common-mode dual output comprising:
a common-mode circuit with an output portion;
a common-mode corrector circuit connected to alternate the states of said output portion between an average output level and a desired common-mode level, the difference between the average and desired levels being proportional to a signal offset level; and
an error correcting circuit connected to said common-mode corrector circuit to adjust the signal offset level;
wherein said common-mode corrector circuit further includes:
a common-mode voltage terminal connected to said output portion through a first pair of switches, said first pair of switches being responsive to alternating clock cycles which alternate the states of said output portion;
a bias terminal providing a bias level, said bias terminal being connected to a first control terminal in said common-mode circuit through a second pair of switches, said second pair of switches being responsive to the alternating clock cycles;
a precharging capacitor which stores the difference between the desired common-mode level and the bias level during a first clock cycle in the alternating clock cycles; and
a common-mode capacitor which stores the average output level during the first clock cycle, said common-mode capacitor and said precharging capacitor being connected in parallel during a second clock cycle in the alternating clock cycles.

2. The circuit of claim 1, wherein said error correcting circuit includes a first capacitor coupled to said comon-mode corrector circuit to reduce the difference between the average and desired levels.

3. The circuit of claim 2, wherein said first capacitor provides impedance matching to said bias terminal and control terminal during the first and second clock cycles, respectively.

4. The circuit of claim 1, wherein said error correcting circuit includes a second capacitor coupled to said bias terminal to reduce the difference between the average and desired levels.

5. The circuit of claim 2, wherein said error correcting circuit is configured to impedance match said bias terminal and control terminal with a terminal of said precharging capacitor.

6. The circuit of claim 1, wherein a capacitance of said precharging capacitor is chosen to be proportional to a capacitance of said first capacitor.

7. The circuit of claim 1, wherein said error correcting circuit includes a switch configured to reduce charge injection between said common-mode circuit and said common-mode corrector circuit.

8. The circuit of claim 1, wherein:
said precharging capacitor is coupled to said output portion; and
said common-mode circuit includes a differential amplifier pair of transistors and a current sinking transistor that includes said bias terminal and that sinks a current from said transistors.

9. The circuit of claim 8, wherein said error correcting circuit includes a transistor switch coupled between said bias terminal and said precharging capacitor to reduce charge injection errors during said first clock cycle.

10. The circuit of claim 1, wherein said error correcting circuit includes a first capacitor coupled to said precharging capacitor and to said common-mode capacitor to reduce the difference between the average and desired levels.

11. An integrated circuit, comprising:
a differential amplifier circuit with an output portion and a current sinking portion, said output portion including dual outputs which provide an average output level;
a common-mode feedback circuit coupled to said output portion, said feedback circuit providing a desired common-mode level in a first operational mode and generating a feedback signal proportional to the difference between the average output level and the desired common-mode level in a second operational mode, the feedback signal being coupled to said current sinking portion; and
an impedance matching circuit connected to said feedback circuit to adjust the feedback signal;
wherein the desired common-mode signal is provided to a precharging capacitor in the first operational mode, said precharging capacitor including a terminal coupled to said impedance matching circuit.

12. The integrated circuit of claim 11, wherein said impedance matching circuit is configured to reduce charge injection in said terminal when switching between the first and second operational modes.

13. The integrated circuit of claim 12, wherein said terminal is coupled to a bias terminal during the first operational mode and is coupled to said current sinking portion during the second operational mode.

14. The integrated circuit of claim 13, wherein said impedance matching circuit is configured to impedance match said terminal with at least one of said bias terminal and said current sinking portion when switching between the first and second operational modes, respectively.

15. The integrated circuit of claim 14, further including a switch configured to provide charge balancing between said current sinking portion and said feedback circuit.

16. The integrated circuit of claim 15, wherein an area of said switch is chosen to obtain a desired charge injection level through said switch.

17. The integrated circuit of claim 15, wherein said switch includes a field effect transistor with a control terminal coupled with the first operational mode.

18. A switched capacitor amplifier which provides an output signal in response to an input signal and corrects the average output level of the output signal in accordance with a desired common-mode level, said amplifier comprising:
a differential amplifier with an output portion and a current sinking portion, said output portion providing the output signal;
a switched capacitor common-mode feedback circuit coupled between said output portion and said current sinking portion, said feedback circuit being configured to alternate the states of said output portion between the average output level on a precharging capacitor and the desired common-mode level on a commonmode feedback capacitor in response to alternating clock cycles, the difference between the average and desired levels being proportional to a signal offset level;
an impedance matching circuit coupled to said feedback circuit to adjust the signal offset level, said impedance matching circuit including a charge balancing switch configured to reduce feedthrough between said differential amplifier and said feedback circuit.

19. The amplifier of claim 18, wherein said precharging capacitor is connected in parallel to said common-mode feedback capacitor during one cycle in the alternating clock cycles.

20. The amplifier of claim 18, wherein said impedance matching circuit includes a first capacitor configured to reduce a common-mode gain error in said differential amplifier.

21. The amplifier of claim 18, wherein a capacitance of said precharging capacitor is chosen to be in a range from one-half to one times a capacitance of said common-mode feedback capacitor.

22. The amplifier of claim 18, wherein said charge balancing switch includes a field effect transistor with a gate capacitance chosen to provide a desired feedthrough current.

23. The amplifier of claim 18, wherein a capacitance of said charge balancing switch is proportional to a desired charge injection level between said current sinking portion and said feedback circuit.

24. The amplifier of claim 18, wherein said impedance matching circuit includes a first capacitor coupled to a terminal of said precharging capacitor.

25. The amplifier of claim 24, wherein said first capacitor provides a balanced charge transfer between said terminal and a bias terminal during a first clock, cycle in the alternating clock cycles.

26. The amplifier of claim 25, wherein said first capacitor provides a balanced charge transfer between said terminal and said current sinking portion during a second clock cycle in the alternating clock cycles.

27. The amplifier of claim 26, wherein said impedance matching circuit includes a second capacitor coupled to said bias terminal, said second capacitor providing a balanced charge transfer between said bias terminal and said terminal when switching between the first and second clock cycles.

28. The amplifier of claim 27, wherein said second capacitor has a capacitance proportional to the sum of a capacitance of said current sinking portion and a capacitance of a bias circuit connected to said bias terminal.

29. The integrated circuit of claim 11, wherein said current sinking portion responds to the feedback signal to adjust the average output signal.

* * * * *